(12) United States Patent
Tang et al.

US009134077B2

(10) Patent No.: US 9,134,077 B2
(45) Date of Patent: Sep. 15, 2015

(54) HEAT SINK ASSEMBLY WITH CONNECTING MEMBER PROTRUDING FROM HEAT SINK

(71) Applicants: FURUI PRECISE COMPONENT (KUNSHAN) CO., LTD., Kunshan (CN); Foxconn Technology Co., Ltd., New Taipei (TW)

(72) Inventors: Zhen Tang, Kunshan (CN); Jin-Huai Zhou, Kunshan (CN)

(73) Assignees: FURUI PRECISE COMPONENT (KUNSHAN) CO., LTD., Kunshan (CN); Foxconn Technology Co., Ltd., New Taipei (TW)

( * ) Notice: Subject to any disclaimer, the term of this patent is extended or adjusted under 35 U.S.C. 154(b) by 238 days.

(21) Appl. No.: 13/728,943

(22) Filed: Dec. 27, 2012

(65) Prior Publication Data

US 2014/0158323 A1    Jun. 12, 2014

(30) Foreign Application Priority Data

Dec. 7, 2012   (CN) .......................... 2012 1 0522010

(51) Int. Cl.
*F28F 9/007*    (2006.01)
*H01L 23/40*    (2006.01)
*H01L 23/367*   (2006.01)

(52) U.S. Cl.
CPC ................ *F28F 9/007* (2013.01); *H01L 23/40* (2013.01); *H01L 23/3672* (2013.01); *H01L 23/4006* (2013.01)

(58) Field of Classification Search
CPC . H01L 23/3672; H01L 23/40; H01L 23/4006; F28F 9/007
USPC ..................... 165/80.3, 67; 361/704
See application file for complete search history.

(56) References Cited

U.S. PATENT DOCUMENTS

| | | | | |
|---|---|---|---|---|
| 4,765,397 | A * | 8/1988 | Chrysler et al. | 165/104.33 |
| 5,932,925 | A * | 8/1999 | McIntyre | 257/719 |
| 5,969,950 | A * | 10/1999 | Tantoush | 361/704 |
| 6,209,623 | B1 * | 4/2001 | Tantoush | 165/80.3 |
| 2003/0094273 | A1 * | 5/2003 | Toth et al. | 165/183 |
| 2003/0159819 | A1 * | 8/2003 | Lee | 165/185 |
| 2009/0308573 | A1 * | 12/2009 | Sun | 165/80.3 |
| 2010/0000716 | A1 * | 1/2010 | Lian et al. | 165/80.3 |
| 2010/0206522 | A1 * | 8/2010 | Zhou et al. | 165/104.26 |
| 2010/0328897 | A1 * | 12/2010 | Ma et al. | 361/709 |

* cited by examiner

*Primary Examiner* — Tho V Duong
*Assistant Examiner* — Aaron Isenstadt
(74) *Attorney, Agent, or Firm* — Novak Druce Connolly Bove + Quigg LLP

(57) ABSTRACT

An exemplary heat sink assembly includes a heat sink, a connecting member, and a mounting member. A mounting hole and a receiving hole are defined in the heat sink and communicating with each other. The connecting member is adapted for fixing the heat sink. The connecting member includes a connecting section and an extending section extending from the connecting section. The mounting member fixes the connecting member to the heat sink. The connecting section is received in the receiving hole of the heat sink, the extending section is protruding from the heat sink, and the mounting member extends through the mounting hole and engaging with the connecting section to fix the connecting member to the heat sink.

19 Claims, 2 Drawing Sheets

1

HEAT SINK ASSEMBLY WITH CONNECTING MEMBER PROTRUDING FROM HEAT SINK

BACKGROUND

1. Technical Field

The disclosure generally relates to heat sink assemblies, and more particularly to a heat sink assembly for dissipating heat from one or more heat generating components such as electronic device components.

2. Description of Related Art

A typical heat sink assembly includes a heat sink and a metallic sheet fixed to the heat sink. The heat sink is adapted for thermally contacting one or more heat-generating components to dissipate heat generated therefrom. The metallic sheet is adapted for fixing the heat sink on a supporting member, such as a cover of an electronic device. Thereby, the metallic sheet helps prevent the heat sink from moving relative to the heat-generating components, which also helps prevent the heat sink from interfering with other components of the electronic device.

One end of the metallic sheet is fixed to an outer surface of the heat sink by soldering. In the soldering process, solder paste is arranged between the heat sink and the metallic sheet for soldering of the metallic sheet onto the heat sink. However, the solder paste is prone to run before becoming solidified, and may accumulate at a bottom end of a space between the heat sink and the metallic sheet due to gravity. When this happens, the solder paste is unevenly distributed between the heat sink and the metallic sheet. Then when the metallic sheet is soldered onto the heat sink, a joint intensity of a top end of the solder between the metallic sheet and the heat sink is less than that of a bottom end of the solder. As a result, the stability of the connection between the metallic sheet and the heat sink is liable to be diminished.

What is needed, therefore, is an improved heat sink assembly which overcomes the above described shortcomings.

DETAILED DESCRIPTION

Embodiments of a heat sink assembly will now be described in detail below and with reference to the drawings.

Figure 1:
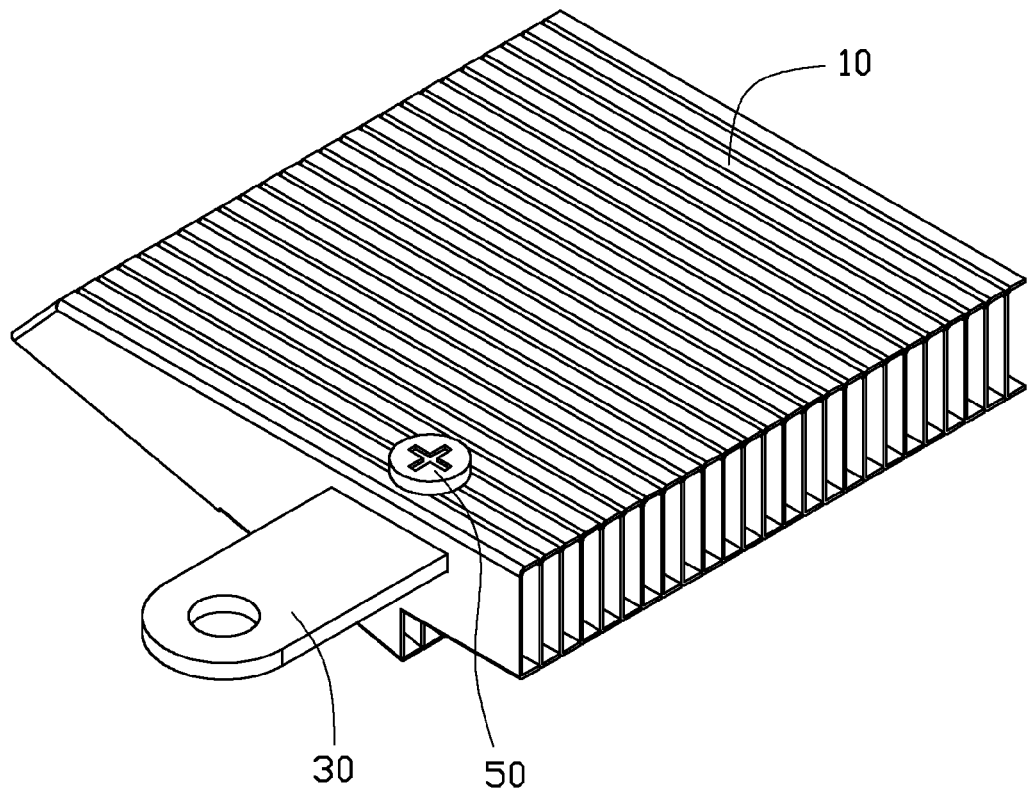
FIG. 1 is an isometric, assembled view of a heat sink assembly according to an exemplary embodiment of the present disclosure.

Referring to FIG. 1, a heat sink assembly 1 in accordance with an exemplary embodiment of the disclosure is shown. The heat sink assembly 1 includes a heat sink 10 for thermally contacting one or more heat generating components (not shown), a connecting member 30 for fixing the heat sink 10 to a supporting member (not shown), and a mounting member 50 fixing the connecting member 30 to the heat sink 10. The supporting member may for example be a cover of an electronic device.

Figure 2:
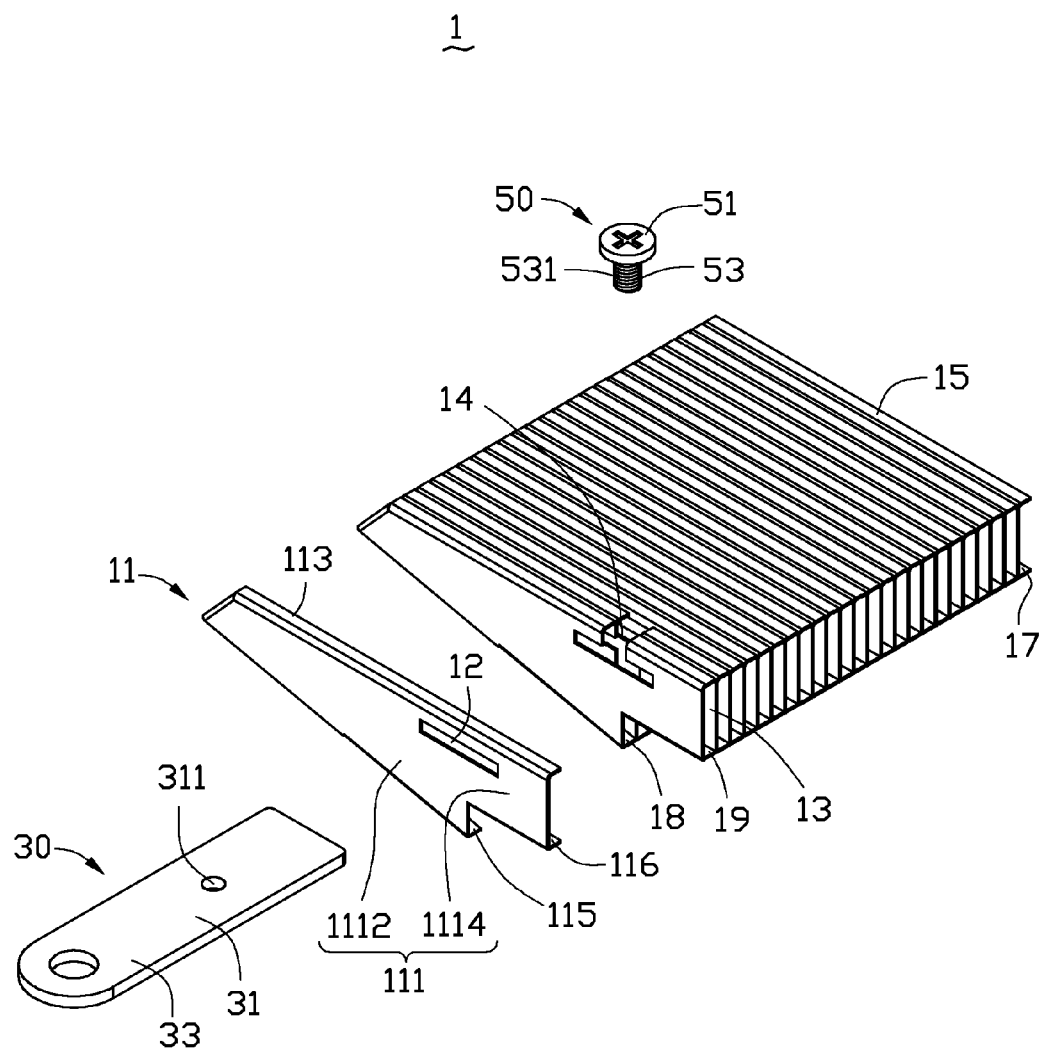
FIG. 2 is an exploded view of the heat sink assembly of FIG. 1.

Referring also to FIG. 2, the heat sink 10 includes a plurality of fins 11 parallel to and aligned with each other. Each fin 11 includes a main body 111, a first flange 113, a second flange 115, and a third flange 116. The main body 111 includes a principal part 1112 and an auxiliary part 1114 integrally extending outwardly from a right lateral end of the principal part 1112. The principal part 1112 is in the form of a trapezoidal sheet, and a height of the principal part 1112 increases from a left lateral end thereof to the right lateral end thereof. The auxiliary part 1114 is in the form of a rectangular sheet, which integrally extends from the right lateral end of the trapezoidal sheet. A height of the auxiliary part 1114 is less than that of the right lateral end of the principal part 1112. A top end of the auxiliary part 1114 is collinear with a top end of the principal part 1112. The top ends of the principal part 1112 and the auxiliary part 1114 cooperatively form a top end of the main body 111. A bottom end of the auxiliary part 1114 is located above a bottom end of the portion of the principal part 1112 nearest the auxiliary part 1114. The bottom end of the principal part 1112 serves as a bottom end of the main body 111.

The first flange 113 is in the form of an elongated sheet bent from the top end of the main body 111. The second flange 115 is in the form of an elongated sheet bent from the bottom end of the main body 111. The third flange 116 is in the form of an elongated sheet bent from the bottom end of the auxiliary part 1114. The first flange 113, the second flange 115 and the third flange 116 are all bent toward the same direction. A transverse width of the first flange 113 is equal to that of each of the second flange 115 and the third flange 116. A sum of a length of the second flange 115 and the third flange 116 is equal to a length of the first flange 113.

When the heat sink 10 is assembled, the fins 11 are aligned with each other along a longitudinal direction of the heat sink 10.

For each two adjacent fins 11, a front end of the first flange 113 of a rearward one of the two fins 11 abuts a rear end of the first flange 113 of a forward one of the two fins 11. Thus, the first flanges 113 of all the fins 11 are coplanar and cooperatively form a hermetical top plate 15 of the heat sink 11. A front end of the second flange 115 of the rear fin 11 abuts a rear end of the second flange 115 of the front fin 11. Thus, the second flanges 115 of all the fins 11 are coplanar and cooperatively form a hermetical bottom plate 17 of the heat sink 11. A front end of the third flange 116 of the rear fin 11 abuts a rear end of the third flange 116 of the front fin 11. Thus, the third flanges 116 of all the fins 11 are coplanar and cooperatively form a hermetical step plate 19 of the heat sink 11. The step plate 19 is parallel to the top plate 15.

The main bodies 111 of all the fins 11 are spaced from and parallel to each other. A first air channel 18 is defined between each two adjacent principal parts 1112. A second air channel 13 is defined between each two adjacent auxiliary parts 1114. The first air channels 18 communicate with the corresponding second air channels 13.

A mounting hole 14 is defined in an upper portion of the heat sink 10, at a front end of the heat sink 10 corresponding to the connecting member 30. The mounting hole 14 is provided to receive the mounting member 50 therein. The mounting hole 14 is rectangular-shaped, and recessed from the top plate 15 along a height direction of the heat sink 10. A receiving hole 12 is defined in the upper portion of the heat sink 10, below and in communication with the mounting hole 14. The receiving hole 12 is rectangular-shaped, and recessed from the front end of the heat sink 10 along the longitudinal direction of the heat sink 10. A bore diameter of the receiving hole 12 is larger than that of the mounting hole 14. Specifically, a length of the receiving hole 12 along the longitudinal direction of the heat sink 10 is larger than that of the mounting hole 14, and a width of the receiving hole 12 along a transverse direction of the heat sink 10 is larger than that of the mounting hole 14. The mounting hole 14 is located above a center portion of the receiving hole 12.

The connecting member 30 is an elongated elastic sheet, and includes a connecting section 31 and an extending section 33 extending outwardly from a free end of the connecting section 31. A size of the connecting section 31 is slightly smaller than or equal to that of the receiving hole 12. A through hole 31 is defined in the connecting section 31, to receive the mounting member 50 therein. A bore diameter of the through hole 31 is less than that of the mounting hole 14. The extending section 33 is adapted for engaging with the supporting member.

The mounting member 50 includes a head 51 and an engaging portion 53 extending down from the head 51. Each the head 51 and the engaging portion 53 is cylindrical. A diameter of the head 51 is larger than that of the engaging portion 53. The engaging portion 53 extends downwardly from a center of a bottom surface of the head 51. A plurality of threads 531 is formed on an outer periphery of the engaging portion 53. The diameter of the head 51 is larger than the bore diameter of the mounting hole 14. The diameter of the engaging portion 53 is less than the bore diameter of the mounting hole 14 and substantially equal to the bore diameter of the through hole 31.

When the heat sink assembly 1 is assembled, the connecting section 31 is inserted into the receiving hole 12, and the through hole 311 is aligned with a center of the mounting hole 14. Edges of the connecting section 31 abut corresponding edges of those fins 11 through which the receiving hole 12 is defined. The engaging portion 53 of the mounting member 50 is inserted into the mounting hole 14 until a bottom end of the engaging portion 53 abuts an edge of the connecting section 31 surrounding the through hole 311. The engaging portion 53 is then screwed to make the engaging portion 53 enter the through hole 311 and tap an inner surface of the connecting section 31 surrounding the through hole 311, until the bottom surface of the head 51 abuts the top plate 15. Thus, the heat sink assembly 1 is assembled completely.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat sink assembly comprising:
   a heat sink formed by a plurality of aligned fins, each fin comprising a main body and a first flange bent from a top end of the main body, the first flanges abutting each other to cooperatively form a top plate of the heat sink, a top end of the heat sink defining a mounting hole recessed from the top plate toward the main bodies of the fins and a receiving hole below the mounting hole being coupled to the mounting hole, the mounting hole extending through the top end of the respective main body;
   a connecting member for fixing the heat sink to an object external to the heat sink, the connecting member comprising a connecting section and an extending section extending from the connecting section, a through hole defined in the connecting section; and
   a mounting member fixing the connecting member to the heat sink;
   wherein the connecting section is received in the receiving hole of the heat sink and the through hole is aligned with the mounting hole, the extending section protrudes from the heat sink, and a bottom end of the mounting member extends through the mounting hole and is engaged with both the heat sink and engaged in the through hole of the connecting section thereby fixing the connecting member to the heat sink, and the bottom end of the mounting member is enclosed by the heat sink.

2. The heat sink assembly of claim 1, wherein the mounting member comprising an engaging portion with a plurality of threads formed on an outer periphery thereof, and the engaging portion is threadedly tapped in an inner surface of the through hole of the connecting section.

3. The heat sink assembly of claim 2, wherein the mounting member further comprises a head located at a top of the engaging portion, a diameter of the head is larger than a bore diameter of the mounting hole, and the head is located at the outside of the heat sink and engagingly abuts the top plate of the heat sink.

4. The heat sink assembly of claim 1, wherein edges of the connecting section abut edges of fins through which the receiving hole is defined.

5. The heat sink assembly of claim 1, wherein the mounting hole is recessed from a top surface of the heat sink along a height direction of the heat sink, and the receiving hole is recessed from the front end of the heat sink along a longitudinal direction of the heat sink.

6. The heat sink assembly of claim 5, wherein the mounting hole is located above a center portion of the receiving hole.

7. The heat sink assembly of claim 6, wherein the main bodies are spaced from each other, and the first flanges are aligned with each other.

8. The heat sink assembly of claim 1, wherein a horizontal cross-section of the receiving hole is larger than a horizontal cross-section of the mounting hole.

9. The heat sink assembly of claim 7, wherein the main bodies are parallel to each other.

10. The heat sink assembly of claim 7, wherein each fin comprises a second flange bent from a bottom end of the main body, and the second flanges of the fins are aligned with each other and cooperatively form a hermetical bottom plate of the heat sink.

11. The heat sink assembly of claim 10, wherein the main body of each fin comprises a principal part and an auxiliary part extending outwardly from a right lateral end of the principal part, and a top end of the principal part and a top end of the auxiliary part are collinear and cooperatively form the top end of the main body.

12. The heat sink assembly of claim 11, wherein the principal part is in a form of a trapezoidal sheet, a height of the principal part increases from a left end to a right end thereof, a bottom end of the auxiliary part is located above a bottom end of the portion of the principal part nearest the auxiliary part, and the second flange is bent from the bottom end of the principal part.

13. The heat sink assembly of claim 12, wherein each fin further comprises a third flange bent from the bottom end of the auxiliary part, and the third flanges of the fins are aligned with each other and cooperatively form a hermetical step plate of the heat sink.

14. The heat sink assembly of claim 13, wherein the step plate is parallel to the top plate.

15. The heat sink assembly of claim 13, wherein for each fin, a sum of a length of the second flange and the third flange is equal to a length of the first flange.

16. The heat sink assembly of claim 13, wherein a transverse width of the first flange is equal to that of the second flange and that of the third flange.

17. The heat sink assembly of claim 13, wherein the first flange, the second flange and the third flange are bent toward the same direction.

18. The heat sink assembly of claim 11, wherein a first air channel is defined between each two adjacent principal parts and a second air channel is defined between each two adjacent auxiliary parts and communicates with the first air channel.

19. The heat sink assembly of claim 1, wherein the connecting member is an elastic sheet.

* * * * *